(12) United States Patent
Suda

(10) Patent No.: US 10,826,490 B2
(45) Date of Patent: Nov. 3, 2020

(54) SWITCH CIRCUIT

(71) Applicant: Murata Manufacturing Co., Ltd., Kyoto (JP)

(72) Inventor: Toshio Suda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/529,936

(22) Filed: Aug. 2, 2019

(65) Prior Publication Data

US 2019/0356309 A1    Nov. 21, 2019

Related U.S. Application Data

(63) Continuation of application No. PCT/JP2018/002181, filed on Jan. 25, 2018.

(30) Foreign Application Priority Data

Feb. 8, 2017    (JP) .................................. 2017-021409

(51) Int. Cl.
*H03K 17/687* (2006.01)
*H03K 17/10* (2006.01)

(52) U.S. Cl.
CPC ......... *H03K 17/687* (2013.01); *H03K 17/102* (2013.01)

(58) Field of Classification Search
CPC .......... H02M 3/07; H02M 3/158; H02M 1/36; H02J 7/345; H03K 17/687; H03K 17/6871; H03K 17/6874
See application file for complete search history.

(56) References Cited

U.S. PATENT DOCUMENTS

| | | | |
|---|---|---|---|
| 8,836,408 B1 * | 9/2014 | den Besten | H03K 17/04163 327/310 |
| 9,106,227 B2 | 8/2015 | Ranta et al. | |

(Continued)

FOREIGN PATENT DOCUMENTS

| | | |
|---|---|---|
| JP | 2011-249466 A | 12/2011 |
| JP | 2016-171498 A | 9/2016 |
| WO | 2009/022654 A1 | 2/2009 |

OTHER PUBLICATIONS

International Search Report for International Application No. PCT/JP2018/002181, dated Apr. 24, 2018.

(Continued)

*Primary Examiner* — Sibin Chen
(74) *Attorney, Agent, or Firm* — Pearne & Gordon LLP

(57) ABSTRACT

A switch circuit includes FETs including a first FET group including m FETs, a second FET group including n FETs at a position away from the input terminal than the first FET group, and an intermediate FET between the first FET group and the second FET group, and capacitive elements including m capacitive elements, n capacitive elements, and an intermediate capacitive element, the capacitive element ($C1_i$) (i is an integer between 1 and m inclusive) is connected in parallel to i consecutive FETs of the first FET group starting from a top closer to the input terminal, the capacitive element ($C2_j$) (j is an integer between 1 and n inclusive) is connected in parallel to j consecutive FETs of the second FET group starting from a top closer to the input terminal, and the intermediate capacitive element is connected in parallel to the intermediate FET.

15 Claims, 5 Drawing Sheets

(56) References Cited

U.S. PATENT DOCUMENTS

| | | |
|---|---|---|
| 2010/0060377 A1 | 3/2010 | Takahashi |
| 2011/0294445 A1 | 12/2011 | Goto et al. |
| 2014/0312958 A1 | 10/2014 | Ranta et al. |
| 2016/0269025 A1 | 9/2016 | Kunishi et al. |
| 2017/0250667 A1* | 8/2017 | Cheon .................. H03H 7/0161 |

OTHER PUBLICATIONS

Written Opinion for International Application No. PCT/JP2018/002181, dated Apr. 24, 2018.

* cited by examiner

SWITCH CIRCUIT

This is a continuation of International Application No. PCT/JP2018/002181 filed on Jan. 25, 2018 which claims priority from Japanese Patent Application No. 2017-021409 filed on Feb. 8, 2017. The contents of these applications are incorporated herein by reference in their entireties.

BACKGROUND

Technical Field

The present disclosure relates to switch circuits.

Switch circuits to be installed in mobile communication devices such as cellular phones and the like use, for example, field effect transistors (FETs). In such switch circuits formed from FETs, a configuration is known, in which a withstanding voltage of a switch circuit is improved by multistage-connecting a plurality of FETs to meet a demand for an increase in input power. In this configuration, a voltage divided by the number of stages of multistage-connected FETs is applied across a source and a drain of each FET. This enables to obtain an input allowable voltage based on the number of stages of FETs.

Power of a signal supplied to an input terminal of a switch circuit is voltage-divided by the parasitic capacitance of each FET, and thus a phenomenon of gradual increase in voltage applied across the source and the drain of each FET from an output terminal side toward an input terminal side occurs. In this case, there is a risk that a voltage exceeding the withstanding voltage may be applied to a FET relatively close to the input terminal and the FET may be destroyed. Accordingly, in order to achieve the increase in input power in a switch circuit, the unevenness of the source-drain voltage can be removed.

For example, patent document 1 discloses a configuration that achieves an even distribution of the source-drain voltage on each FET by providing capacitive elements connected in parallel to several consecutive FETs starting from a FET close to the input terminal. In this configuration, the drain voltage of each FET is raised by directly connecting the source (that is, a terminal at which a voltage amplitude due to an input signal is relatively large) of the FET close to the input terminal and the drain of each FET, thereby removing the unevenness of the source-drain voltage.

Patent Document 1: U.S. Pat. No. 9,106,227 Specification

BRIEF SUMMARY

Here, in the multistage-connected FETs, the amount of FET drain voltage to be raised for achieving the even distribution of the source-drain voltage decreases as the position of the FET becomes farther away from the input terminal (that is, closer to the output terminal), and thus the required capacitance value of the capacitive element decreases. Accordingly, with the configuration disclosed in the patent document 1, the capacitance value of the capacitive element for raising the drain voltage of the FET far from the input terminal becomes extremely small. Therefore, the control may be difficult to achieve, and the ratio of non-defective products (yield) may decrease.

The present disclosure provides a switch circuit that achieves the increase in input power and the improvement of the ratio of non-defective products.

A switch circuit according to an aspect of the present disclosure includes: an input terminal to which a signal is inputted; an output terminal from which a signal is outputted; a plurality of FETs that is multistage-connected in between the input terminal and the output terminal, on and off of each FET of the plurality of FETs being controlled in response to a control voltage supplied to each gate; and a plurality of capacitive elements, wherein the plurality of FETs includes a first FET group including m (m is an integer equal to or more than two) adjacent FETs, a second FET group including n (n is an integer equal to or more than two) adjacent FETs, the second FET group being provided at a position farther away from the input terminal than the first FET group, and an intermediate FET connected between the first FET group and the second FET group, the plurality of capacitive elements includes m capacitive elements ($C1_1$, $C1_2$, ..., $C1_m$), n capacitive elements ($C2_1$, $C2_2$, ..., $C2_n$), and an intermediate capacitive element, the capacitive element ($C1_i$) (i is an integer between 1 and m inclusive) is connected in parallel to i consecutive FETs of the first FET group starting from a top closer to the input terminal, the capacitive element ($C2_j$) (j is an integer between 1 and n inclusive) is connected in parallel to j consecutive FETs of the second FET group starting from a top closer to the input terminal, and the intermediate capacitive element is connected in parallel to the intermediate FET.

The present disclosure enables to provide a switch circuit that achieves the increase in input power and the improvement of the ratio of non-defective products.

DETAILED DESCRIPTION

Hereinafter, embodiments of the present disclosure are described in detail with reference to the drawings. Note that the same reference codes are attached to the same elements, and overlapping descriptions thereof are omitted.

Figure 1:
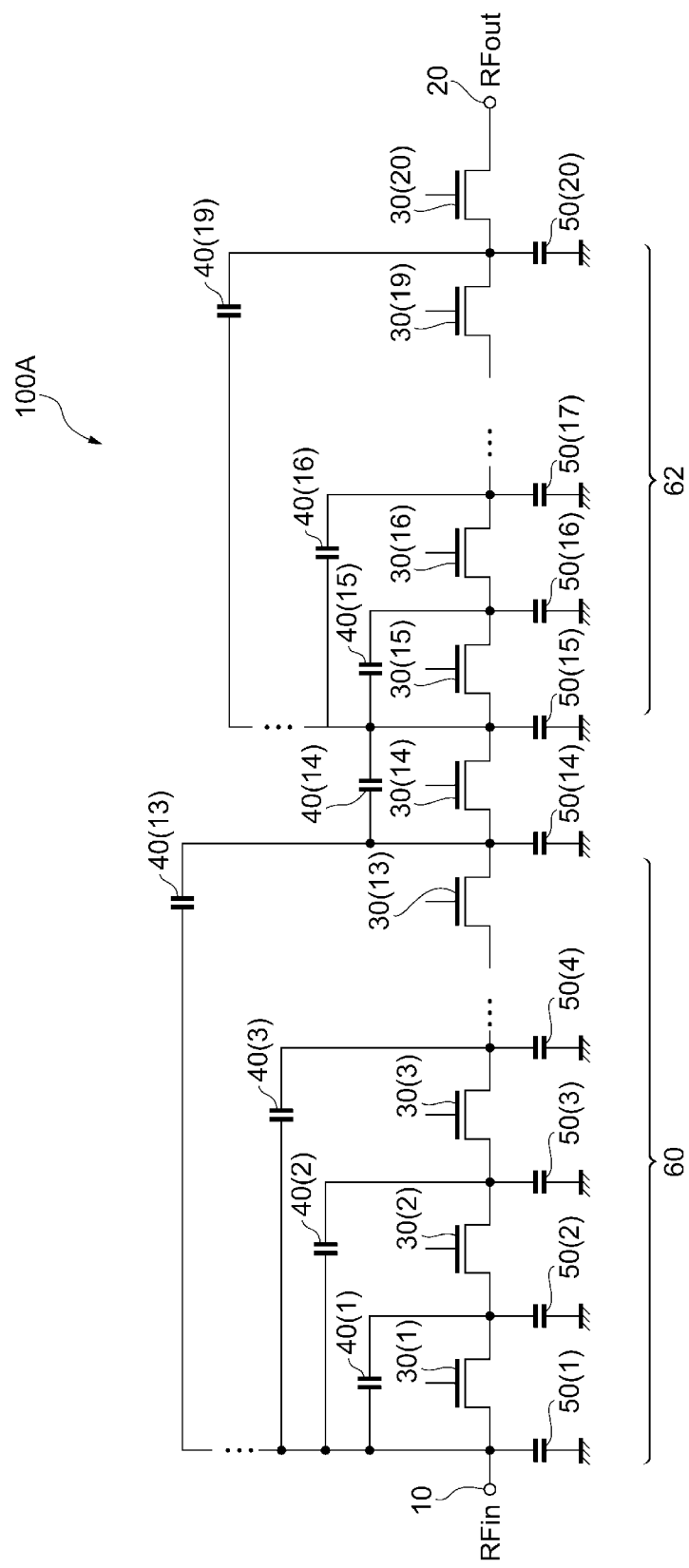
FIG. 1 is a diagram illustrating an example of a configuration of a switch circuit 100A according to a first embodiment of the present disclosure.

FIG. 1 is a diagram illustrating an example of a configuration of a switch circuit 100A according to a first embodiment of the present disclosure. A device that uses the switch circuit 100A is not particularly limited. However, in the present specification, as an example, a case where the switch circuit 100A is used in a power amplifier module to be installed in a mobile communication device such as a cellular phone or the like is assumed and described below. Specifically, for example, the switch circuit 100A may be used as a switch that provides electrical continuity for a radio frequency (RF) signal inputted from an input terminal to an output terminal. Particularly, since the switch circuit 100A is allowed to have a high input power as will be described below, the switch circuit 100A may be used as a band-switching switch, which is to be provided in between a power amplifier and an antenna (that is, a signal path after a RF signal is amplified by the power amplifier), an antenna switch, or the like.

As illustrated in FIG. 1, the switch circuit 100A includes, for example, an input terminal 10, an output terminal 20, twenty FETs 30(1) to 30(20), and nineteen capacitive elements 40(1) to 40(19). Note that the numbers of the FETs and the capacitive elements are an exemplification and not limited thereto. Note that in the present specification, a h-th FET (h is an integer between 1 and 20 inclusive) counting from the input terminal 10 side is denoted by "30(h)". The same applies to the other elements. Further, twenty capacitive elements 50(1) to 50(20) illustrated in FIG. 1 equivalently represent parasitic capacitances of the FETs 30(1) to 30(20). Further, in the following description, a N-channel metal-oxide-semiconductor field effect transistor (MOSFET) is used as an example of the FET. Note that similar advantageous effects can be obtained with a configuration using P-channel MOSFETs. However, the configuration is similar to a configuration using N-channel MOSFETs, and thus a detail description thereof is omitted.

The twenty FETs 30(1) to 30(20) (hereinbelow, in the case where these twenty FETs are not distinguished from each other, it may also be referred to simply as "each FET 30". The same applies to the other elements) are multistage-connected in between the input terminal 10 and the output terminal 20. Specifically, the FETs 30(1) to 30(20) are each connected in series. That is, a drain and a source of adjacent FETs are connected. Further, although it is not illustrated, a control voltage is supplied to a gate of each FET 30. When all the multistage-connected FETs are turned on in response to the control voltages, the electrical continuity between the input terminal 10 and the output terminal 20 is provided. In this case, an input signal RFin supplied to the source of the FET 30(1) is outputted from the drain of the FET 30(20) as an output signal RFout. On the other hand, when at least one of the FET is turned off, the electrical continuity between the input terminal 10 and the output terminal 20 is not provided, and the output signal is not outputted. Although it is not illustrated, for example, a resistive element may be connected in series to the gate of each FET 30, and the control voltage may be supplied to the gate via the resistive element.

If the switch circuit 100A did not include the capacitive elements 40, the source-drain voltage of each FET 30 would be uneven due to the parasitic capacitance of each FET 30 (correspond to the capacitive elements 50(1) to 50(20) illustrated in FIG. 1) when a RF signal is supplied to each FET 30 that is multistage-connected. Specifically, the closer the FET is to the input terminal 10, the higher the source-drain voltage becomes. Accordingly, the input allowable voltage of the switch circuit is limited by a withstanding voltage of the FET close to the input terminal. In this regard, the switch circuit 100A enables to achieve an even distribution of the source-drain voltage on each FET 30 by adjusting the capacitance value of each capacitive element 40. Hereinafter, a connection configuration of each capacitive element 40 is described in detail. Note that for the sake of convenience, in the following description, an element to be connected between the source and the drain of each FET 30 is referred to as a "capacitive element". However, this element is not necessarily to be an "element" and includes any other structure having a charge accumulation functionality similar to the "capacitive element", which will be described below.

A plurality of multistage-connected FETs in the switch circuit 100A includes a first set of FET group, a second set of FET group, and at least one FET (hereinafter, referred to as intermediate FET) connected between the first FET group and the second FET group. The first set of FET group includes m (m is an integer equal to or more than 2) adjacent FETs, and the second set of FET group is formed at a position further away from the input terminal 10 and closer to the output terminal 20 than the first set of FET group and includes n (n is an integer equal to or more than 2) adjacent FETs. Further, each capacitive element 40 is connected in parallel to i (i is an integer between 1 and m inclusive) consecutive FETs of the first set of FET group starting from its top FET closer to the input terminal, or j (j is an integer between 1 and n inclusive) consecutive FETs of the second set of FET group starting from its top FET closer to the input terminal, or the intermediate FET.

For example, in the example illustrated in FIG. 1, thirteen (that is, m=13) adjacent FETs 30(1) to 30(13) form the first set of FET group 60 (first FET group), and five (that is, n=5) adjacent FET 30(15) to FET 30(19) form the second set of FET group 62 (second FET group). Here, the FET group 62 is provided at a position farther away from the input terminal 10 than the FET group 60. Further, the FET 30(14) is the intermediate FET connected between the FET group 60 and the FET group 62.

Thirteen capacitive elements 40(k) (k is an integer between 1 and 13 inclusive) are each connected in parallel to k consecutive FETs of the FET group 60 starting from FET 30(1) (that is, the top of the FET group 60 closer to the input terminal 10). That is, the capacitive element 40(1) (capacitive element ($C1_1$)) to 40(13) (capacitive element ($C1_{13}$)) are all connected to the source of the FET 30(1) at one end portion and are respectively connected to the drains of the FETs 30(1) to 30(13) at the other end portion. Further, five capacitive elements 40(14+l) (l is an integer between 1 and 5 inclusive) are each connected in parallel to l consecutive FETs of the FET group 62 starting from FET 30(15) (that is, the top of the FET group 62 closer to the input terminal 10). That is, the capacitive element 40(15) (capacitive element ($C2_1$)) to 40(19) (capacitive element ($C2_5$)) are all connected to the source of the FET 30(15) at one end portion and are respectively connected to the drains of the FETs 30(15) to 30(19) at the other end portion.

The capacitive element 40(14) (intermediate capacitive element) is connected in parallel to the intermediate FET. That is, the capacitive element 40(14) is connected to the source of the FET 30(14) at one end portion and connected to the drain of the FET 30(14) at the other end portion. The capacitive element 40(14) is provided to prevent the concentration of electric field at the intermediate FET between the FET groups.

Adjusting the capacitance value of each capacitive element 40 enables to adjust the amount of drain voltage to be raised for each FET 30. This compensates the parasitic capacitance of each FET 30, thereby removing the unevenness of the source-drain voltage. Specifically, for example, the capacitance values of the capacitive elements 40(1) to 40(13) connected to the FET group 60 are adjusted in such a way that the capacitance value of the capacitive element 40 monotonically decreases from the input terminal 10 side toward the output terminal 20 side and monotonically increases from the capacitive element (for example, the capacitive element 40(11)), which serves as a boundary, connected to the FET in a middle stage. In other words, the adjustment is performed in such a way that the capacitance values of the capacitive element 40(1) (capacitive element ($C1_1$)) and the capacitive element 40(13) (capacitive element ($C1_{13}$)) are larger than the capacitance value of the capacitive element 40(x) (x is an integer between 2 and 12 inclusive). That is, the capacitance value of the capacitive element 40(14) connected to the intermediate FET is relatively larger, and thus the drain voltages of the FETs 30(12)

and 30(13) near the intermediate FET tend to be lower compared with the other FETs. Because of this, the capacitance values needed to raise the drain voltages of the FETs 30(12) and 30(13) are larger. Accordingly, in the FET group 60, the capacitance values of several capacitive elements closer to the output terminal 20 monotonically increase. On the other hand, the capacitance values of the capacitive elements 40(15) to 40(19) connected to the FET group 62 are adjusted in such a way that the capacitance value of the capacitive element 40 monotonically decreases from the input terminal 10 side toward the output terminal 20 side.

Here, in the configuration disclosed in the patent document 1 (hereinafter, referred to as a prior art example), all capacitive elements are directly connected from a FET close to an input terminal. Accordingly, the capacitance value of the capacitive element for raising the drain voltage of the FET far from the input terminal becomes extremely small, and thus the control may be difficult to achieve. On the other hand, in the switch circuit 100A, the capacitive elements 40 are divided and connected to the FET group 60 and the FET group 62 as described above. Because of this, in the FET group 62 farther away from the input terminal 10, the capacitive elements 40(15) to 40(19) are connected at one end portion to the source of the FET 30(15) in a middle stage of the twenty multistage-connected FETs (that is, a terminal at which the voltage amplitude is smaller compared with the source of the FET closest to the input terminal). That is, compared with the prior art example, the capacitance values needed to raise the drain voltages of the FETs 30(15) to 30(19) are larger. Accordingly, in the switch circuit 100A, the even distribution of the source-drain voltage on each FET 30 can be achieved without necessarily using a minute capacitance. That is, the switch circuit 100A enables to achieve the improvement of the ratio of non-defective products compared with the prior art example while increasing the input power.

Note that the foregoing total numbers of the FETs and the capacitive elements are an exemplification and not limited thereto. For example, the total number of the multistage-connected FETs is not particularly limited as long as the sum of the FETs (at least two) in the first set of FET group, the intermediate FET (at least one), and the FETs (at least two) in the second set of FET group is five or more. Further, not only one but also two or more intermediate FETs may be included.

Further, as will be described below as a second embodiment, the configuration of the FET groups is not limited to the foregoing configuration as long as the total number of the FET groups is two or more. Further, the FET (corresponds to the FET 30(20) in the example illustrated in FIG. 1) that is not included in the FET group or the intermediate FET may be included.

Further, the multistage-connected FETs may be formed by connecting individual FETs in series as illustrated in FIG. 1, or a multi-gate FET may alternatively be used.

Further, the FETs 30(1) to 30(20) are not limited to MOSFETs, but may be other FETs such as, for example, junction field effect transistors (JFETs), metal-semiconductor field effect transistors (MESFETs), or the like.

Figure 2:
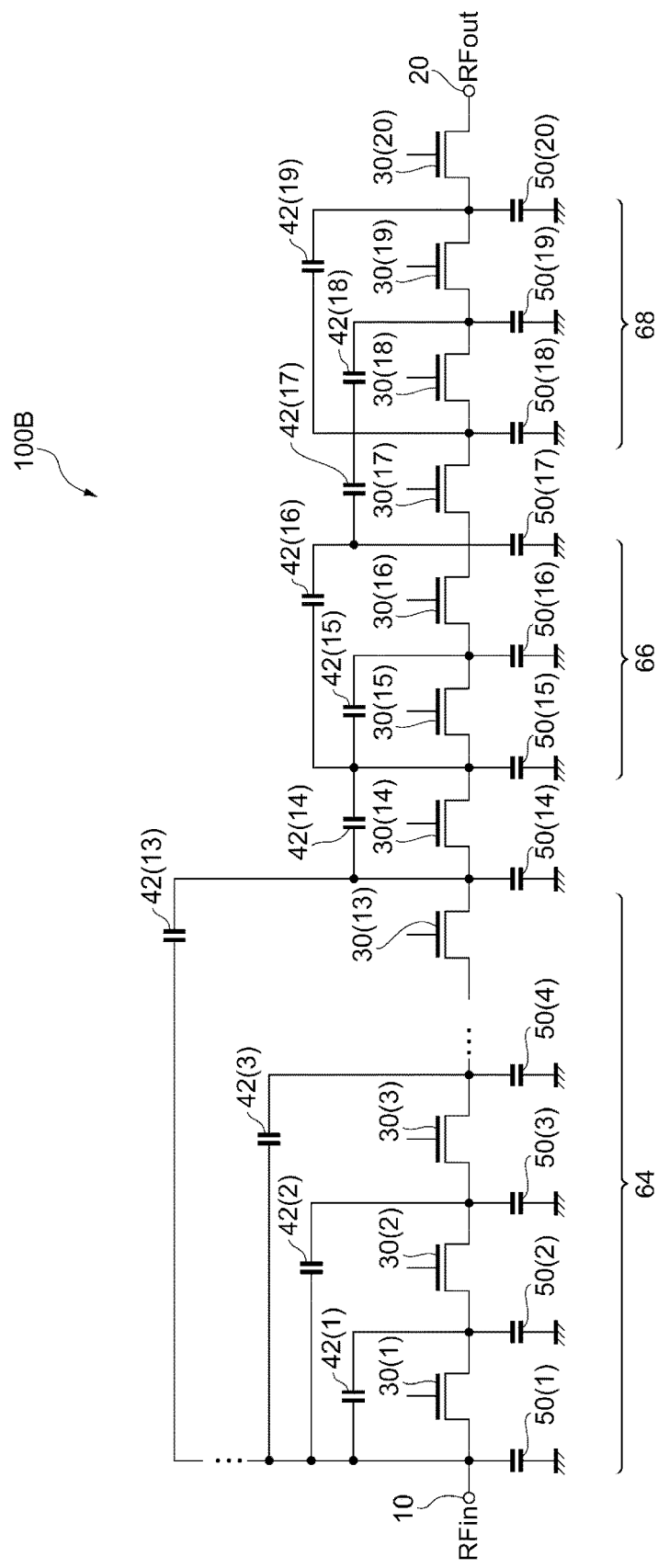
FIG. 2 is a diagram illustrating an example of a configuration of a switch circuit 100B according to a second embodiment of the present disclosure.

FIG. 2 is a diagram illustrating an example of a configuration of a switch circuit 100B according to a second embodiment of the present disclosure. Note that the same reference codes are attached to the same elements as those of the switch circuit 100A, and descriptions thereof are omitted. Further, in the second embodiment, the descriptions regarding matters common to the first embodiment will be omitted, and only the points different from the first embodiment will be described. Particularly, similar functions and effects produced by similar configurations will not be repeated in every embodiment.

Compared with the switch circuit 100A, the switch circuit 100B is different in the configuration of division of FET groups and the configuration of connection of capacitive elements. Specifically, in the switch circuit 100B, the FET groups are divided into three (FET groups 64, 66, and 68), and capacitive elements 42(1) to 42(19) are divided and connected the respective FET groups. Dividing positions of the FET groups are not particularly limited. However, in the example illustrated in FIG. 2, for example, FETs 30(1) to 30(13) form the first set of FET group 64, FETs 30(15) and 30(16) form the second set of FET group 66, and FETs 30(18) and 30(19) form the third set of FET group 68. Here, the FET group 66 is provided at a position farther away from the input terminal 10 than the FET group 64, and the FET group 68 is provided at a position farther away from the input terminal 10 than the FET group 66. Further, the FET 30(14) is connected between the FET group 64 and the FET group 66, and the FET 30(17) is connected between the FET group 66 and the FET group 68.

The capacitive elements 42(1) to 42(13) are connected to the FETs included in the FET group 64, the capacitive elements 42(15) and 42(16) are connected to the FETs included in the FET group 66, and the capacitive elements 42(18) and 42(19) are connected to the FETs included in the FET group 68. Further, the capacitive element 42(14) is connected to the FET 30(14), and the capacitive element 42(17) is connected to the FET 30(17). Note that the configuration of connection of the respective capacitive elements in the FET groups 64, 66, and 68 is similar to the configuration of connection of the capacitive elements in the FET groups 60 and 62 in the switch circuit 100A, and thus the detail description thereof is omitted.

Even with such configuration, as with the switch circuit 100A, the switch circuit 100B enables to achieve the improvement of the ratio of non-defective products compared with the prior art example while increasing the input power. Further, compared with the switch circuit 100A, the total number of the FET groups increases in the switch circuit 100B. Because of this, in the FET group 68 farther away from the input terminal 10, the capacitive elements 42(18) and 42(19) are connected at one end portion to the source of the FET 30(18) (that is, a source at which the voltage amplitude is even smaller compared with the source of the FET 30(15) in the switch circuit 100A). That is, compared with the switch circuit 100A, the capacitance values needed to raise the drain voltages of the FETs 30(18) and 30(19) are larger. Accordingly, compared with the switch circuit 100A, the switch circuit 100B enables the further improvement of the ratio of non-defective products.

Figure 3:
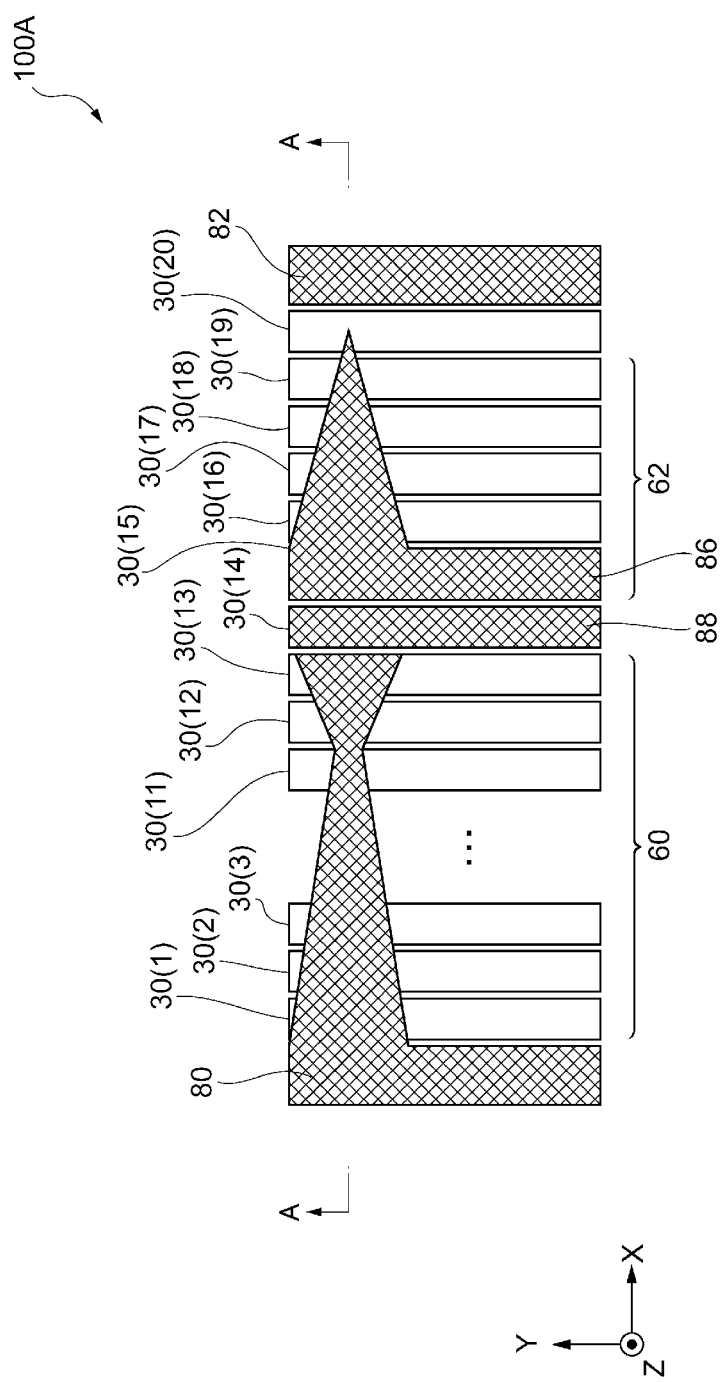
FIG. 3 is a plan view illustrating a layout of the switch circuit 100A according to the first embodiment of the present disclosure.
Figure 4:
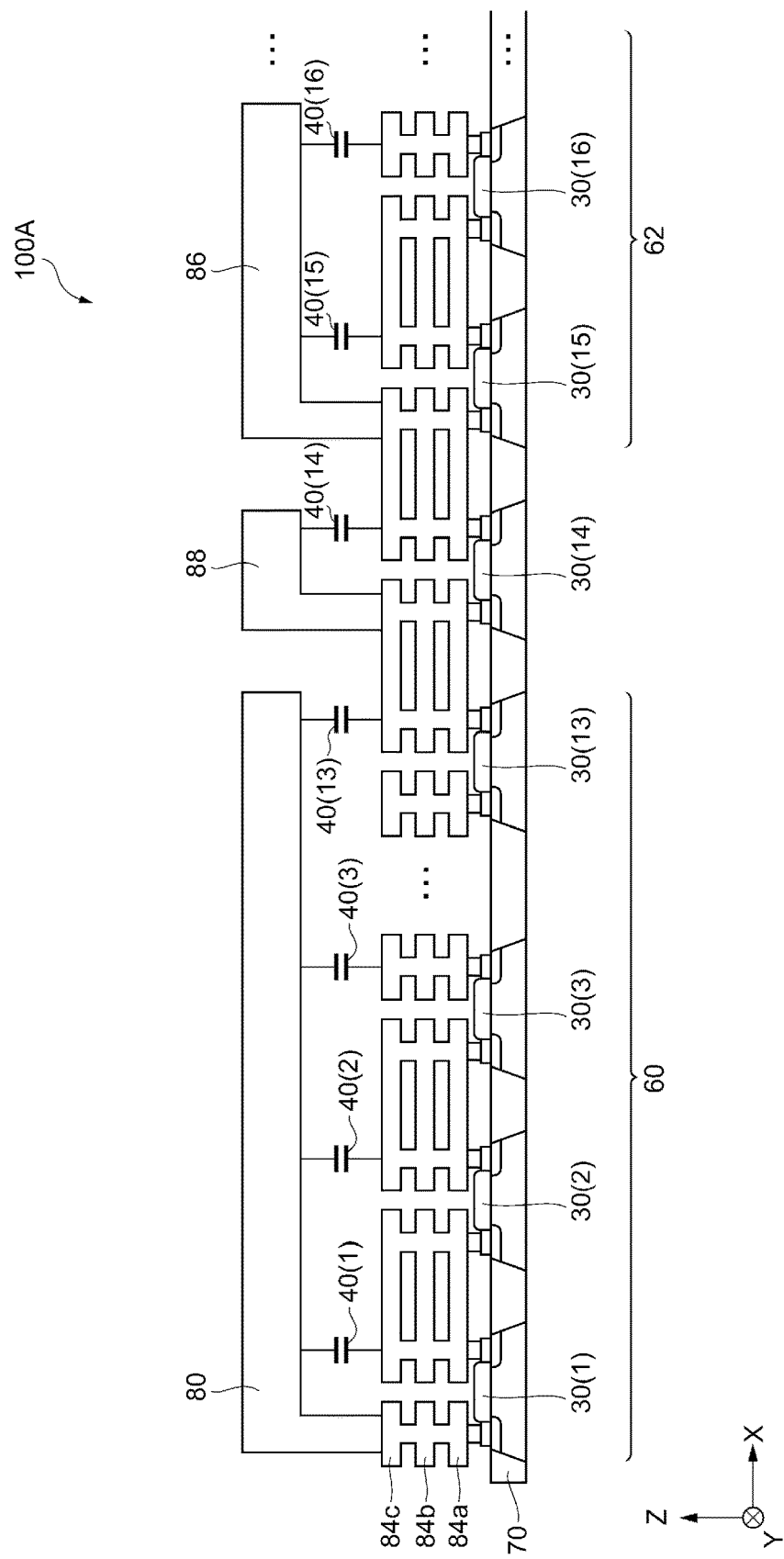
FIG. 4 is a cross-sectional view at line A-A of FIG. 3.

Next, referring to FIG. 3 and FIG. 4, an example of a layout of the switch circuit 100A is described. Here, FIG. 3 is a plan view illustrating the layout of the switch circuit 100A according to the first embodiment of the present disclosure. FIG. 4 is a cross-sectional view at line A-A of FIG. 3. Note that in FIG. 3 and FIG. 4, for the sake of convenience, the same reference codes are attached to the same elements as those in the switch circuit 100A. Further, in FIG. 4, some of the elements illustrated in FIG. 3 are omitted.

On a principal surface (Z-axis positive direction side) of a substrate 70 parallel to a X-Y plane defined by an X-axis (first direction) and a Y-direction (second direction) that are orthogonal to each other, the FET group 60, the intermediate FET, and the FET group 62 are arranged in this order along the X-axis direction (first direction) between a metal layer 80 closer to the input terminal (X-axis negative direction side) and a metal layer 82 closer to the output terminal (X-axis positive direction side) (see FIG. 3 and FIG. 4). Further, each FET 30 is electrically connected by a plurality of metal layers 84a, 84b, and 84c stacked on each FET 30 (see FIG. 4).

In the present embodiment, of a plurality of metal layers formed on the FET group 60, the uppermost metal layer 80 (first metal layer) extends from the input terminal side toward the output terminal side. Because of this, charge is accumulated between the metal layer 80 and the FET group 60. Because this charge accumulation has a functionality similar to a capacitive element, the capacitive elements 40(1) to 40(13) illustrated in FIG. 1 are formed. In other words, the capacitive elements 40(1) to 40(13) comprise at least a portion of the first FET group 60 and the first metal layer 80 provided on or above the first FET group 60. Note that the symbol of the capacitive element illustrated in FIG. 4 is used to simulate the functionality of allowing charge to be accumulated between the metal layer and the FET group and is not intended to represent the existence of capacitive element. Similarly, of a plurality of metal layers formed on the FET group 62, the uppermost metal layer 86 (second metal layer) extends from the input terminal side toward the output terminal side. Because of this, charge is accumulated between the metal layer 86 and the FET group 62, and the capacitive elements 40(15) to 40(19) are formed. In other words, the capacitive elements 40(15) to 40(19) comprise at least a portion of the second FET group 62 and the second metal layer 86 provided on or above the second FET group 62. Further, in the present embodiment, the capacitance values of the capacitive elements 40(1) to 40(13) and 40(15) to 40(19) are respectively adjusted according to lengths of the metal layers 80 and 86 in the Y-axis direction (second direction) in the plan view (viewed from a direction perpendicular to the principal surface of the substrate 70) of the principal surface of the substrate 70, respectively (see FIG. 3). Specifically, the length of the metal layer 80 in the Y-axis direction gradually decreases from the input terminal side toward the output terminal side and increases again from a predetermined middle stage FET (FET 30(11) in the example illustrated in FIG. 3), which serves as a boundary. On the other hand, the length of the metal layer 86 in the Y-axis direction gradually decreases from the input terminal side toward the output terminal side. Because of this, the FET groups 60 and 62 are each adjusted in such a way that the capacitance value of each capacitive element becomes a desired magnitude. Applying this configuration enables to facilitate a design change from a configuration that does not include the capacitive elements 40.

Further, the capacitive element 40(14) (intermediate capacitive element) is formed by allowing charge to be accumulated between the FET 30(14) and the metal layer 88 (intermediate metal layer) formed on the FET 30(14). The metal layer 88 may be formed, for example, by extending a finger electrode of the FET 30(14).

Note that in FIG. 3 and FIG. 4, the example in which each FET 30 is arranged in a single row is illustrated. However, each FET 30 is not necessarily arranged in a single row. Particularly, in the present disclosure, the capacitive elements 40 are provided in the respective FET groups, and thus the arrangement of the FETs on the substrate may also be divided for the respective FET groups. Accordingly, in the present disclosure, flexibility in layout of each FET 30 is high, compared with the prior art example.

Figure 5:
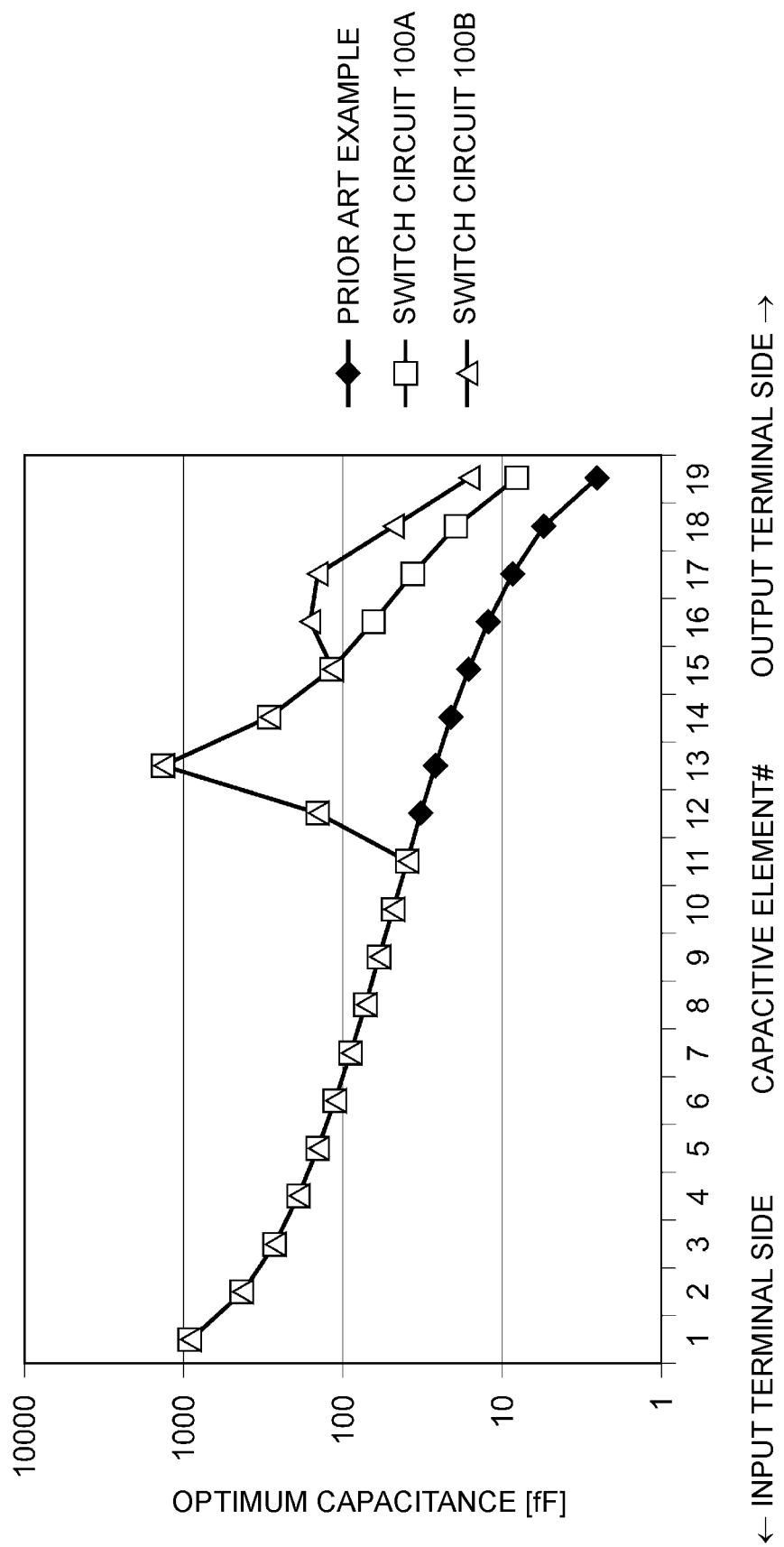
FIG. 5 is a graph illustrating an example of simulation results of capacitance values of capacitive elements in switch circuits according to the first and second embodiments of the present disclosure and a prior art example.

FIG. 5 is a graph illustrating an example of simulation results of the capacitance values of the capacitive elements in the switch circuits according to the first and second embodiments of the present disclosure and the prior art example. The simulation indicates the capacitance values of respective capacitive elements when the source-drain voltage of each FET is evenly distributed in respective switch circuits in each of which twenty FETs are multistage-connected. Note that for the sake of convenience, reference codes 1 to 19 are used in sequence from the capacitive element close to the input terminal. Further, these simulations are results of comparison between the switch circuit 100A illustrated in FIG. 1, the switch circuit 100B illustrated in FIG. 2, and the prior art example (configuration in which all capacitive elements are directly connected to the source of the FET closest to the input terminal). In the graph illustrated in FIG. 5, the vertical axis represents the optimum capacitance value (fF) of each capacitive element, and the horizontal axis represents the reference code attached in sequence to the capacitive element from the input terminal.

As illustrated in FIG. 5, in the prior art example, the capacitance value of the capacitive element monotonically decreases from the input terminal side toward the output terminal side. Particularly, the capacitance value of the 19th capacitive element (that is, the capacitive element having the minimum capacitance value) is 2.6 fF, and this may be a minute capacitance difficult to control.

On the other hand, in the switch circuit 100A (see FIG. 1), the capacitance value of the capacitive element in the first set of FET group 60 monotonically decreases from the 1st to 11th and monotonically increases from the 11th capacitive element, which serves as a boundary. On the other hand, the capacitance value of the capacitive element in the second set of FET group 62 monotonically decreases from the 15th to 19th. However, all the capacitance values are larger, compared with the 15th to 19th capacitive elements in the prior art example. Note that the capacitance value of the 19th capacitive element is 8.3 fF.

Further, in the switch circuit 100B (see FIG. 2), the capacitive elements in the first set of FET group 64 are similar to the case with the FET group 60 in the switch circuit 100A. Further, the capacitance value of the capacitive element in the second set of FET group 66 monotonically increases from 15th to 16th. Further, the capacitance value of the capacitive element in the third set of FET group 68 monotonically decreases from the 18th to 19th. However, all the capacitance values are larger, compared with the 18th and the 19th capacitive elements in the prior art example and the switch circuit 100A. Note that the capacitance value of the 19th capacitive element is 16.8 fF.

As described above, it is found that by connecting the capacitive elements to the respective FET groups, the capacitance values of the capacitive elements connected to the FETs close to the output terminal increase compared with the prior art example. That is, from these simulation results, it can be said that in the switch circuits 100A and 100B, the even distribution of the source-drain voltage on each FET 30 can be achieved without necessarily using a minute capacitance.

The exemplary embodiments of the present disclosure have been described. The switch circuits 100A and 100B include the first set of FET groups 60 and 64, the second set of FET groups 62 and 66, and the intermediate FET connected between these two FET groups, respectively. Further, the FET groups 60 and 64 or the FET groups 62 and 66 include the capacitive elements 40 and 42 connected in parallel to several consecutive FETs starting from the top FET closer to the input terminal 10 and the capacitive element 40(14) and 42(14) connected in parallel to the intermediate FET, respectively. Because of this, in the FET groups 62 and 66 away from the input terminal 10, the capacitance value needed to raise the drain voltage of the FET is larger compared with the prior art example. Accordingly, in the switch circuits 100A and 100B, the even distribution of the source-drain voltage on each FET 30 can be achieved without necessarily using a minute capacitance. That is, the switch circuits 100A and 100B enable to achieve the increase in input power and the improvement of the ratio of non-defective products.

Further, in the switch circuits 100A and 100B, the capacitance values of the capacitive elements 40 and 42 in the first set of FET groups 60 and 64 monotonically decrease from the input terminal 10 side toward the output terminal 20 side and monotonically increase from the capacitive element, which serves as a boundary, connected to the FET in a middle stage, respectively. This adjusts the amount of drain voltage to be raised for each FET 30. Accordingly, the parasitic capacitance of each FET 30 is compensated, and the unevenness of the source-drain voltage is removed.

Further, in the switch circuit 100A, the FET group 60, the intermediate FET, and the FET group 62 are arranged on the substrate 70, and the capacitive elements 40 are formed using the metal layers 80 and 86 extended from the input terminal side toward the output terminal side and the metal layer 88 formed on the intermediate FET. This enables to facilitate a design change from a configuration that does not include the capacitive elements 40.

Further, in the switch circuit 100A, the lengths of the metal layers 80 and 86 in the Y-axis direction in the plan view of the principal surface of the substrate 70 are adjusted according to the capacitance values of the capacitive elements 40 and 42, respectively. Because of this, in each of the FET groups 60 and 62, the capacitance value of each capacitive element can be set at a desired magnitude by making an easy design change.

Each of the embodiment described above is provided to facilitate understanding of the present disclosure and is not to be construed as limiting the present disclosure. The present disclosure can be modified or improved without necessarily departing from its spirit, and the present disclosure also includes equivalents thereof. That is, ones obtained by suitably modifying designs of the respective embodiments by those skilled in the art are also included within the scope of the present disclosure as long as they include features of the present disclosure. For example, each element included in each embodiment as well as its arrangement, material, condition, shape, size, and the like are not limited to those exemplified, and may be suitably changed. Further, elements included in the respective embodiments may be combined as long as technically feasible, and ones obtained by combining those are also included within the scope of the present disclosure as long as they include the features of the present disclosure.

REFERENCE SIGNS LIST

10 Input terminal
20 Output terminal
30 FET
40, 42, 50 Capacitive element
60, 62, 64, 66, 68 FET group
70 Substrate
80, 82, 84, 86, 88 Metal layer
100A, 100B Switch circuit

The invention claimed is:

1. A switch circuit comprising:
an input terminal to which a signal is inputted;
an output terminal from which the signal is outputted;
a plurality of FETs that is multistage-connected between the input terminal and the output terminal, wherein an on and off state of each FET of the plurality of FETs is controlled in response to a control voltage supplied to a gate of each FET of the plurality of FETs; and
a plurality of capacitive elements, wherein
the plurality of FETs includes
a first FET group including m adjacent FETs, the m being an integer equal to or more than two,
a second FET group including n adjacent FETs, the n being an integer equal to or more than two, the second FET group being provided at a position farther away from the input terminal than the first FET group, and
an intermediate FET connected between the first FET group and the second FET group,
the plurality of capacitive elements including:
m capacitive elements including capacitive elements $C1_1, C1_2, \ldots, C1_m$,
n capacitive elements including capacitive elements $C2_1, C2_2, \ldots, C2_n$, and an intermediate capacitive element,
a capacitive element $C1_i$ is connected in parallel to i consecutive FETs of the first FET group, each one end of the capacitive element $C1_i$ starting from an input terminal of the first FET group, the i being an integer between 1 and m inclusive,
a capacitive element $C2_j$ is connected in parallel to j consecutive FETs of the second FET group, each one end of the capacitive element $C2_j$ starting from an input terminal of the second FET group, the j being an integer between 1 and n inclusive, and
the intermediate capacitive element is connected in parallel to the intermediate FET.

2. The switch circuit according to claim 1, wherein
a capacitance value of the capacitive element $C1_1$ and a capacitance value of the capacitive element $C1_m$ are larger than a capacitance value of the capacitive element $C1_x$, x being an integer between 2 and m-1 inclusive.

3. The switch circuit according to claim 2, wherein
the first FET group, the intermediate FET, and the second FET group are arranged in this order along a first direction on a principal surface of a substrate,
the capacitive elements $C1_1, C1_2, \ldots, C1_m$ comprise at least a portion of the first FET group and a first metal layer provided on or above the first FET group,
the capacitive elements $C2_1, C2_2, \ldots, C2_n$ comprise at least a portion of the second FET group and a second metal layer provided on or above the second FET group,
the intermediate capacitive element comprises the intermediate FET and an intermediate metal layer provided on or above the intermediate FET, and
the first metal layer and the second metal layer extend in the first direction from an input terminal side toward an output terminal side.

4. The switch circuit according to claim 1, wherein
the first FET group, the intermediate FET, and the second FET group are arranged in this order along a first direction on a principal surface of a substrate, the capacitive elements $C1_1, C1_2, \ldots, C1_m$ comprise at least a portion of the first FET group and a first metal layer provided on or above the first FET group, the capacitive elements $C2_1, C2_2, \ldots, C2_n$ comprise at least a portion of the second FET group and a second metal layer provided on or above the second FET group, the intermediate capacitive element comprises the intermediate FET and an intermediate metal layer provided on or above the intermediate FET, and the first metal layer and the second metal layer extend in the first direction from an input terminal side toward an output terminal side.

5. The switch circuit according to claim 4, wherein
the intermediate metal layer is provided by extending a finger electrode of the intermediate FET.

6. The switch circuit according to claim 5, wherein
in a plan view of the principal surface of the substrate, lengths of the first metal layer and the second metal layer in a second direction are adjusted according to capacitance values of the capacitive elements $C1_1, C1_2, C1_m$ and capacitance values of the capacitive elements $C2_1, C2_2, \ldots, C2_n$, respectively, the second direction being parallel to the principal surface of the substrate and orthogonal to the first direction.

7. The switch circuit according to claim 4, wherein
in a plan view of the principal surface of the substrate, lengths of the first metal layer and the second metal layer in a second direction are adjusted according to capacitance values of the capacitive elements $C1_1, C1_2, \ldots, C1_m$ and capacitance values of the capacitive elements $C2_1, C2_2, \ldots, C2_n$, respectively, the second direction being parallel to the principal surface of the substrate and orthogonal to the first direction.

8. The switch circuit according to claim 1, wherein:
each capacitive element $C1_i$ is connected at one end to a source of a first one of the i consecutive FETs of the first FET group and at another end to a drain of each of the i consecutive FETs of the first FET group, and each capacitive element $C2_j$ is connected at one end to a source of a first one of the j consecutive FETs of the second FET group and at another end to a drain of each of the i consecutive FETs of the second FET group.

9. The switch circuit according to claim 1, wherein:
the intermediate capacitive element is connected at one end to a source of the intermediate FET and at another end to a drain of the intermediate FET.

10. A switch circuit comprising:
an input terminal to which a signal is inputted;
an output terminal from which the signal is outputted;
a plurality of FETs that is multistage-connected between the input terminal and the output terminal, wherein an on and off state of each FET of the plurality of FETs is controlled in response to a control voltage supplied to a gate of each FET of the plurality of FETs; and
a plurality of capacitive elements, wherein
the plurality of FETs includes
a first FET group including m adjacent FETs, the m being an integer equal to or more than two,
a second FET group including n adjacent FETs, the n being an integer equal to or more than two, the second FET group being provided at a position farther away from the input terminal than the first FET group,
a third FET group including l adjacent FETs, the l being an integer equal to or more than two, the third FET group being provided at a position farther away from the input terminal than the second FET group,
a first intermediate FET connected between the first FET group and the second FET group, and
a second intermediate FET connected between the second FET group and the third FET group, the plurality of capacitive elements including:
m capacitive elements including capacitive elements $C1_1, C1_2, \ldots, C1_m$,
n capacitive elements including capacitive elements $C2_1, C2_2, \ldots, C2_n$,
l capacitive elements including capacitive elements $C2_1, C2_2, \ldots, C2_l$,
a first intermediate capacitive element, and
a second intermediate capacitive element, a capacitive element $C1_i$ is connected in parallel to i consecutive FETs of the first FET group, each one end of the capacitive element $C1_i$ starting from an input terminal of the first FET group, the i being an integer between 1 and m inclusive, a capacitive element $C2_j$ is connected in parallel to j consecutive FETs of the second FET group, each one end of the capacitive element $C2_j$ starting from an the input terminal of the second FET group, the j being an integer between 1 and n inclusive, a capacitive element $C3_k$ is connected in parallel to k consecutive FETs of the second FET group, each one end of the capacitive element $C3_k$ starting from an the input terminal of the third FET group, the k being an integer between 1 and l inclusive, the first intermediate capacitive element is connected in parallel to the first intermediate FET, and the second intermediate capacitive element is connected in parallel to the second intermediate FET.

11. The switch circuit according to claim 10, wherein:
each capacitive element $C1_i$ is connected at one end to a source of a first one of the i consecutive FETs of the first FET group and at another end to a drain of each of the i consecutive FETs of the first FET group, each capacitive element $C2_j$ is connected at one end to a source of a first one of the j consecutive FETs of the second FET group and at another end to a drain of each of the i consecutive FETs of the second FET group, and each capacitive element $C3_k$ is connected at one end to a source of a first one of the k consecutive FETs of the third FET group and at another end to a drain of each of the k consecutive FETs of the third FET group.

12. The switch circuit according to claim 10, wherein:
the first intermediate capacitive element is connected at one end to a source of the first intermediate FET and at another end to a drain of the first intermediate FET, and the second intermediate capacitive element is connected at one end to a source of the second intermediate FET and at another end to a drain of the second intermediate FET.

13. The switch circuit according to claim 10, wherein
a capacitance value of the capacitive element $C1_1$ and a capacitance value of the capacitive element $C1_m$ are larger than a capacitance value of a capacitive element $C1_x$, x being an integer between 2 and m-1 inclusive.

14. The switch circuit according to claim 10, wherein
the first FET group, the first intermediate FET, the second FET group, the second intermediate FET, and the third FET group are arranged in this order along a first direction on a principal surface of a substrate, the capacitive elements $C1_1$, $C1_2$, $C1_m$ comprise the first FET group and a first metal layer provided on or above the first FET group, the capacitive elements $C2_1$, $C2_2$, ..., $C2_n$ comprise the second FET group and a second metal layer provided on or above the second FET group, the capacitive elements $C2_1$, $C2_2$, ..., $C2_l$ comprise the third FET group and a third metal layer provided on or above the third FET group, the first intermediate capacitive element comprises the first intermediate FET and a first intermediate metal layer provided on or above the first intermediate FET, the second intermediate capacitive element comprises the second intermediate FET and a second intermediate metal layer provided on or above the second intermediate FET, and the first metal layer, the second metal layer, and the third metal layer extend in the first direction from an input terminal side toward an output terminal side.

15. The switch circuit according to claim 14, wherein in a plan view of the principal surface of the substrate, lengths of the first metal layer, the second metal layer, and the third metal layer in a second direction are adjusted according to capacitance values of the capacitive elements $C1_1$, $C1_2$, ..., $C1_m$, the capacitance values of the capacitive elements $C2_1$, $C2_2$, ..., $C2_n$, and the capacitive elements $C2_1$, $C2_2$, ..., $C2_l$, respectively, the second direction being parallel to the principal surface of the substrate and orthogonal to the first direction.

* * * * *